United States Patent
Millette et al.

(10) Patent No.: US 6,246,009 B1
(45) Date of Patent: *Jun. 12, 2001

(54) FABRICATION MULTILAYER COMBINED RIGID/FLEX PRINTED CIRCUIT BOARD

(75) Inventors: Lee J. Millette, Litchfield; A. Roland Caron, Hudson; Joseph A. Thoman, Manchester, all of NH (US)

(73) Assignee: Teledyne Industries, Inc., Los Angeles, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/093,384

(22) Filed: Jun. 8, 1998

Related U.S. Application Data

(62) Division of application No. 08/647,925, filed on May 31, 1996, now Pat. No. 5,877,940.

(51) Int. Cl.[7] ..................................................... H05K 1/03
(52) U.S. Cl. ........................... 174/254; 174/250; 361/750; 428/209; 428/901
(58) Field of Search ..................................... 174/250, 254; 361/750; 428/209, 901, 411.1, 432, 457

(56) References Cited

U.S. PATENT DOCUMENTS

| | | | |
|---|---|---|---|
| 4,634,631 | * 1/1987 | Gazit et al. | 428/432 X |
| 5,095,628 | * 3/1992 | McKenney et al. | 29/846 |
| 5,144,534 | * 9/1992 | Kober | 174/254 X |
| 5,175,047 | * 12/1992 | McKenney et al. | 428/209 |
| 5,288,542 | * 2/1994 | Cibulsky et al. | 174/250 X |
| 5,505,321 | * 4/1996 | Caron et al. | 428/209 X |
| 5,591,519 | * 1/1997 | Caron et al. | 428/209 X |
| 5,723,205 | * 3/1998 | Millette et al. | 428/209 |
| 5,877,940 | * 3/1999 | Millette et al. | 174/254 X |

* cited by examiner

Primary Examiner—Albert W. Paladini
(74) Attorney, Agent, or Firm—Hayes, Soloway, Hennessey, Grossman & Hage, PC

(57) ABSTRACT

A novel basestock composite comprising two copper conducting sheets bonded to insulator layers comprised of fiberglass sheets impregnated with an adhesive such as epoxy, wherein the insulator layers are both affixed to a release layer which is not coextensive with the borders of the insulator layers such that when the basestock is cut at a point internal to its borders and into the release layer the two basestock composites can be separated.

3 Claims, 5 Drawing Sheets

FABRICATION MULTILAYER COMBINED RIGID/FLEX PRINTED CIRCUIT BOARD

This is a divisional of application Ser. No. 08/647,925 filed on May 31, 1996 U.S. Pat. No. 5,877,940 which was based International Application US93/11684 filed on Dec. 2, 1993 and which designated the U.S.

BACKGROUND OF THE INVENTION

1. Field of the Invention

The present invention relates to the fabrication of multilayer combined rigid and flex printed circuits having flexible printed circuits extending from the rigid board. In particular, the present invention relates to an improved process for the fabrication of multilayer combined rigid and flex printed circuits, wherein two circuit boards having rigid and flexible sections can be prepared from a novel basestock composite.

2. Background of the Invention

Techniques for making multilayer rigid flex printed circuit boards are well known in the art. One early example of the prior art is disclosed in U.S. Pat. No. 3,409,732, assigned to the Assignee of the present application and whose teachings are incorporated by reference. Typically a rigid flex stacked printed circuit board includes flexible printed circuit cables extending from the periphery of the rigid section or sections. The rigid portions of the flex cables are typically used as sites for electronic components or mechanical hardware. It is important to note that the copper conductor in each plane or layer is fabricated from one continuous sheet of copper foil.

With improvements in electronic technology, there has been a constant need for advances in electronic packaging. This need has led to more complex multilayer rigid flex printed circuit boards with many boards now using up to twenty-five, or even more, layers of circuitry. However, severe problems developed when the rigid circuit portions included many layers of conductors and holes plated through with copper to provide conductor barrels connecting the conductor layers.

One particular problem, reported on and discussed in U.S. Pat. No. 4,800,461, assigned to the assignee of the present Application, and whose teachings are incorporated by reference, described the fact that in multilayer rigid flex boards which included insulator materials such as acrylic adhesive and Kapton (Kapton is a trademark of E.I. duPont de Nemours and Company Inc. for polyimide film), the insulating materials placed a "Z-axis" stress on plated through holes. The coefficient of thermal expansion, it was reported, of the acrylic adhesive (Z-axis expansion) was the dominate influence. It was observed that because of the amount of acrylic required in many multilayer rigid flex applications, all plated through holes are stressed, with many cracking, making the boards unusable.

To overcome this problem, the '461 patent reported on a novel process to provide a rigid section incorporating insulator materials which, when subjected to elevated temperatures, did not expand in the Z direction to cause difficulties, including delamination and cracking of plated copper barrels. Stated another way, in the '461 patent, the materials causing undesirable expansion in the Z direction in the multilayer rigid section of the board, and the materials absorbing excessive amounts of moisture, such as acrylic adhesives and Kapton, were eliminated from the boards rigid section.

However, although the '461 patent was extremely successful in addressing the various problems recited therein, and in particular, the problem of thermal stresses described above, the process for fabrication of the rigid flex printed circuits has remained limited to the fabrication of a multilayer combined rigid and flex printed circuit board wherein two circuit boards are always prepared from a basestock composition, and remain attached to one another via the prepreg. In other words, the process of fabrication according to the teachings of the prior art begin with the step of laminating two conductor layers (i.e. copper layers) to a single insulator layer (prepreg) followed by imaging and etching. Accordingly if one of the two bonded conductor layers was somehow improperly imaged, it was necessary to discard the entire lamination.

It is therefore an object of this invention to provide a process for the fabrication of a multilayer combined rigid and flex printed circuits, wherein two circuit boards having rigid and flex sections can be prepared and imaged from a novel basestock composite, followed by separation into two individual single sided basestock laminates.

It is also an object of this invention to provide a novel basestock composition of sufficient planarity and rigidity to permit adequate handling and further processing thereof, and which can be separated into two individual layers each comprising an imaged copper layer laminated to a fiberglass sheet which is impregnated with adhesives such as an epoxy.

SUMMARY OF THE INVENTION

The present invention provides a multilayer rigid flex printed circuit board fabricated by a novel process and from a novel basestock composite wherein two copper sheets are laminated to a prepreg and in-between said laminated copper sheets is placed a release material that is not coextensive with the boarders of the prepreg, such that the basestock can be imaged and processed in the usual manner, and such that cutting the edges of the basestock material, after imaging; at a location internal to the basestock border provides a cut into the release layer, thereby allowing for separation of the two individual imaged copper layers and their supporting prepreg, along with the removal of said release material.

The present invention also comprises in process form, a process for the fabrication of a rigid flex printed circuit comprising the steps of laminating a pair of conductor layers to respective opposite surfaces of an insulating layer wherein the insulator layers are both affixed to a release layer and wherein said release layer is not coextensive with the borders of the insulator layers, thereby forming a basestock composite. The basestock composite is then imaged and etched on the conductor layers to form conductor patterns. The basestock is then cut at a point internal to its borders and into the release layer thereby separating the two imaged and etched conductor layers and removing said release material from the insulating layer.

Alternatively, the novel basestock composite can be made without a release layer, and such a basestock composite which contains two copper layers permanently affixed to one another, or the single copper layer prepared from a basestock composite containing a release layer, can be converted into a novel multilayer rigid flex printed circuit board.

BRIEF DESCRIPTION OF THE DRAWINGS

The foregoing and other features and advantages of the present invention will be more readily understood and will become apparent from the following detailed description taken n conjunction with the drawings, in which.

DETAILED DESCRIPTION OF THE INVENTION

Figure 1:
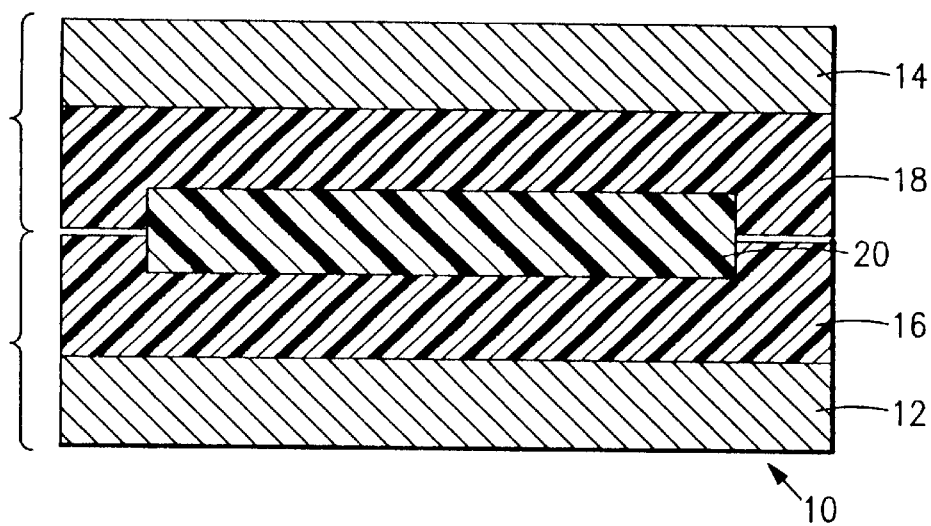
FIG. 1 is an exploded view of the novel basestock composite.

In the first exemplary embodiment of the invention shown in FIG. 1, the novel basestock composite 10 is shown to comprise two copper conducting sheets 12 and 14, for example, one or two ounce copper, bonded to insulator layers 16 and 18 comprised of fiberglass sheets impregnated with an adhesive such as epoxy, and commonly referred to as prepreg. Also shown in FIG. 1 is the release material 20 and the release material is shown as not being coextensive with the borders of the insulating layers 16 and 18. The release material can be poly(vinyl fluoride)

Accordingly, it can be appreciated that in the method of preparation of the novel basestock composite 10, a pair of conducting sheets or layers, 12 and 14, are laminated to the opposite surfaces of insulating layers 16 and 18, wherein the insulating layers are both affixed to a release layer 20 and wherein said release layer is not coextensive with the borders of the insulating layers. It can be appreciated that the basestock composite comprising the pair of conducting sheets has sufficient planarity and rigidity to permit handling and further processing thereof, and in particular, imaging to form conductor patterns.

Figure 2:
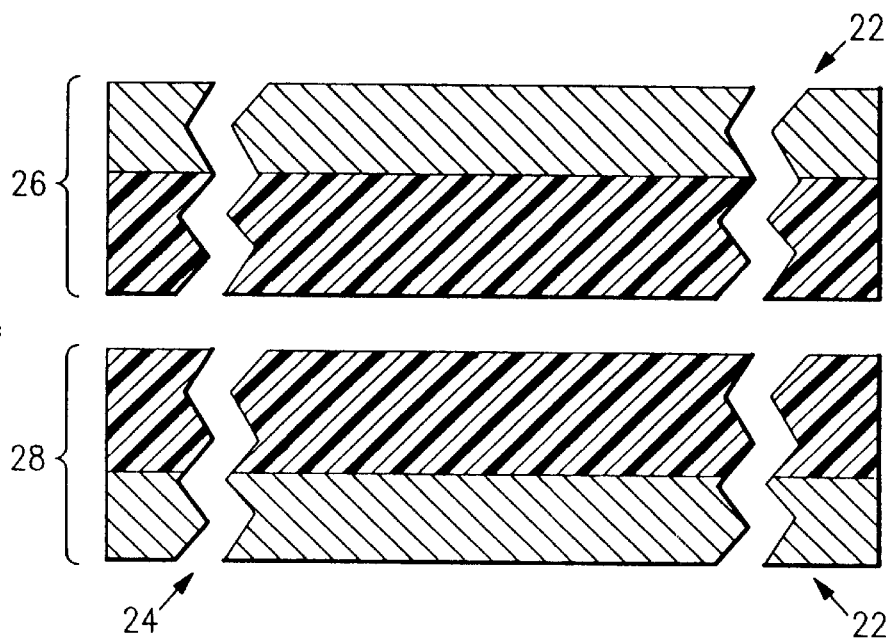
FIG. 2 is an exploded view of the novel basestock composite showing it cut at a point internal to its borders and into the release layer.

Turning then to FIG. 2, the basestock composite which has been imaged and etched to form conductor patterns 22, is cut at a point internal to its borders 24 and into and through the release layer 20 and the two conductor layer patterns 26 and 28 are separated and the release material is removed from the insulating layers. Each conductor layer can then be further processed, as described below.

Figure 3:
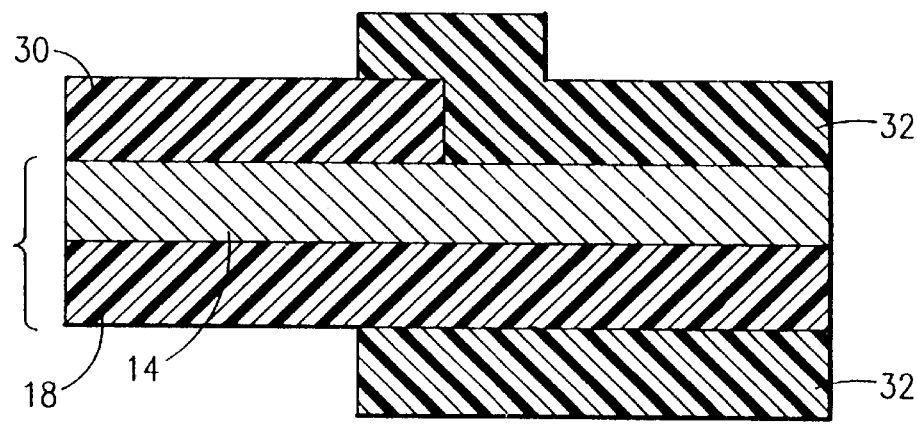
FIG. 3 is an exploded view of the novel basestock composite with a prepreg and Kapton/acrylic covercoat.
Figure 4:
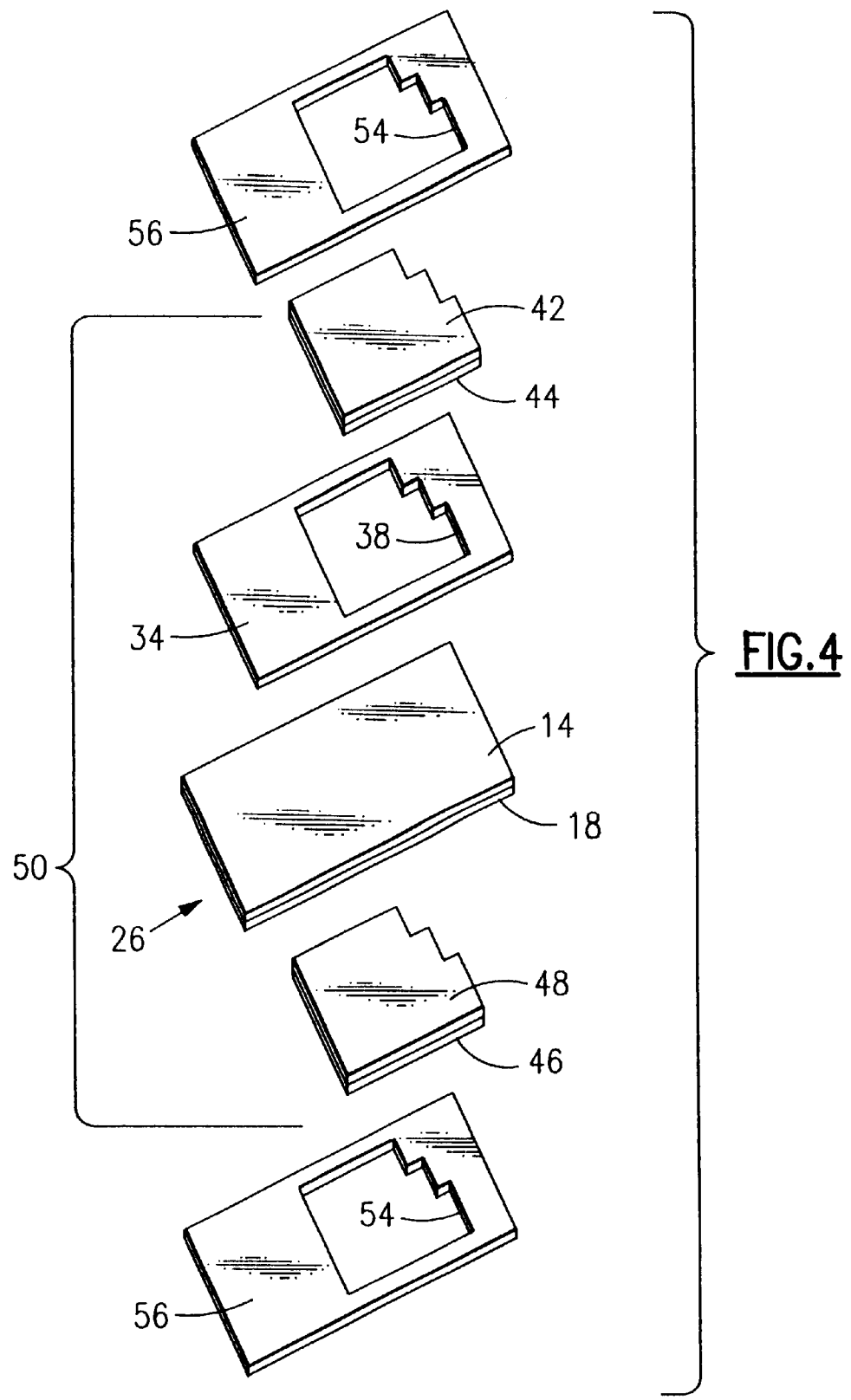
FIG. 4 is an exploded view of a single conductor layer used to fabricate a multilayer combined rigid and flex printed circuit.
Figure 5:
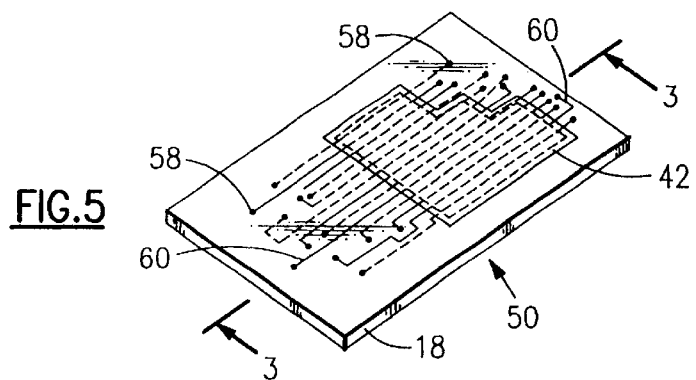
FIG. 5 is a view in perspective of the layers of FIG. 4 following lamination and certain processing steps.

FIG. 3 shows one of the separated conductive layers 14 and its adjacent prepreg 18 further covered with another prepreg layer covercoat 30 and a flexible insulating layer of a Kapton/acrylic covercoat 32. Alternatively, the Kapton/acrylic covercoat 32 can be replaced with a less expensive photoimagable solder mask.

In an exemplary embodiment of the invention shown in FIGS. 4–7, the formation of the multilayer rigid flex printed circuits begins with supplying a conductor pattern 26 or 28 followed by an initial processing step which includes treating the exposed copper conductor patterns to enhance bondability of another epoxy prepreg to the copper, for example, by the black oxide process typically used in the rigid board field. One additional insulator prepreg sheets 34, having cutout 38, is positioned on one side of the base stock 26. A flexible insulator of Kapton 42, covered with a layer of suitable adhesive 44, for example, an acrylic adhesive which provides excellent bonding of Kapton to copper, is positioned on one side of the glass sheet 34. A similar sheet of Kapton 46 covered with a layer of adhesive 48 is located on the other side of the glass sheet 26. Insulator layers such as Kapton and acrylic adhesive afford flexibility and tear resistance characteristics to the flex sections, as discussed in connection with FIGS. 6 and 7. Alternatively, the Kapton 46 and adhesive 48 can be replaced with a photoimagable solder mask.

Figure 6:
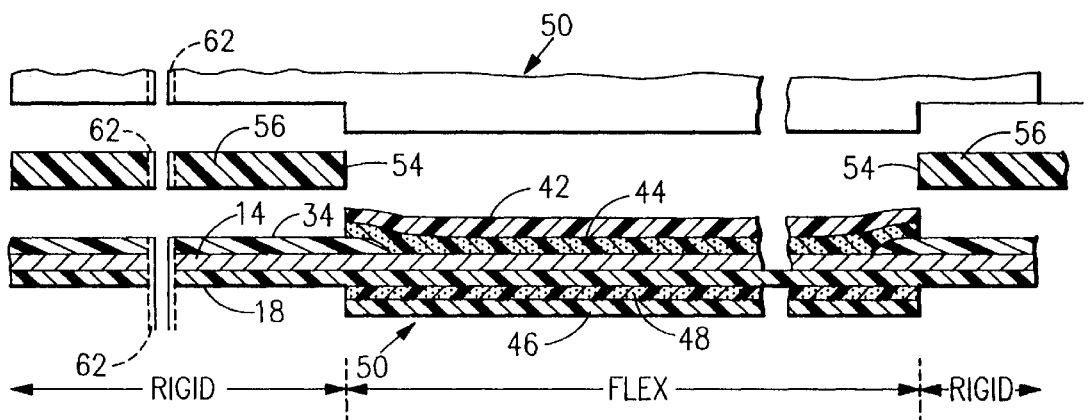
FIG. 6 is a cross section taken along view line 3—3 in FIG. 5 and enlarged for clarity.

As shown in FIG. 6, the Kapton sheets 42 and 46 and their associated adhesive layers 44 and 48 are slightly longer than the length of the cutouts 38 in the glass layers to overlap slightly the sheet 34 by, for example 0.050 inch. The sandwich formed by the foregoing sheets is then laminated together to provide the printed circuit structure 50 shown in FIGS. 4 and 5. Note that in the interests of clarity, the sides of the cutouts are not shown in FIG. 7.

After lamination processing, a number of the printed circuits 50 are stacked in proper registration with epoxy impregnated fiberglass layers 52 (FIG. 7) positioned between, for example, seven of the circuits 50. For clarity, only two of the printed circuit structures 50 are shown with the upper circuit 50 illustrated diagrammatically and broken away.

Figure 7:
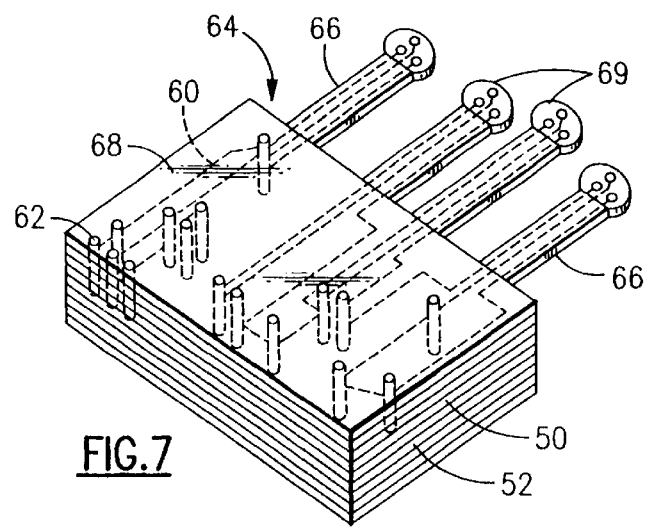
FIG. 7 is a perspective view diagrammatically showing the inventive rigid flex circuits following lamination and other processing steps of the structures shown in FIGS. 5 and 6.
Figure 8:
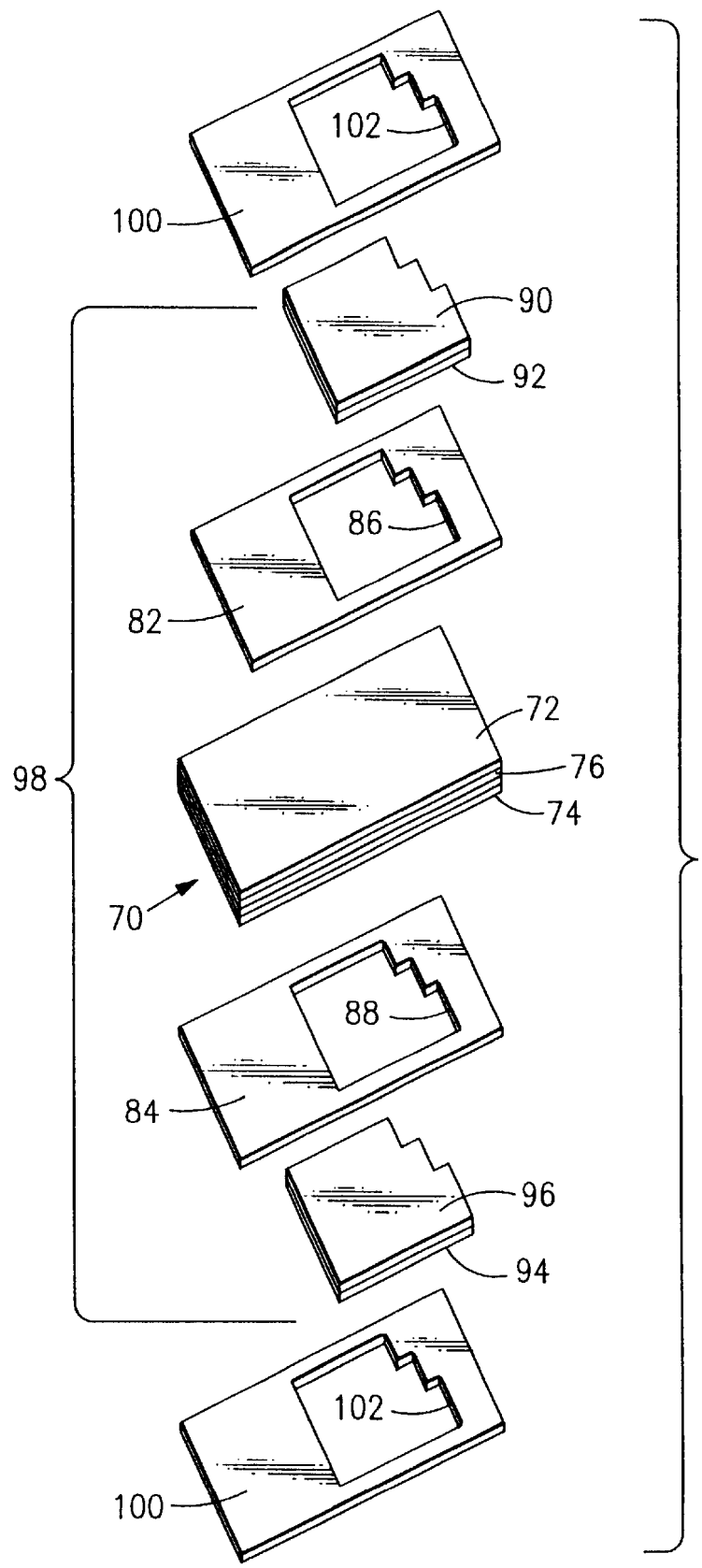
FIG. 8 is an exploded view of the sheet materials used to form the layers of structures forming the inventive rigid flex circuits, wherein the basestock contain two laminated copper sheets without a release layer.
Figure 9:
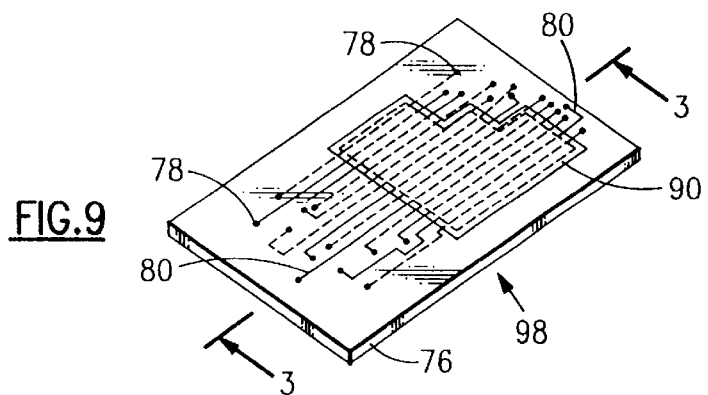
FIG. 9 is a view in perspective of the layers of FIG. 8 following lamination and certain processing steps.

Note that cutouts 54 in the prepreg sheets 56 are slightly longer than the cutouts 38 (FIG. 4) and coextensive with the Kapton layers 42 and 46 so that the Kapton layers 42 and 46 abut the edges of the sheets 56, as shown in FIG. 7.

Prior to stacking the circuits 50, it is desirable to cut the flex cables, shown in FIG. 7, that extend through the cutout areas, to simplify the final construction of the rigid flex printed circuit structure.

After stacking seven of the circuits 50 with appropriate outer caps, the layers are laminated to provide, in this example, a nine layer rigid flex circuit (the outer caps add in this example one layer per cap), and holes are then drilled at appropriate pads 58 to interconnect desired conductors 60. The holes are then desmeared by a suitable process, for example, exposing them to appropriate cleaning chemicals to expose fully the copper conductors, a rapid process due to the absence of any adhesives or insulating material resistant to such chemicals, such as acrylics and Kapton, in the rigid circuit portion. If desired, plasma desmearing techniques can be used instead of chemical cleaning.

The holes are then plated through to interconnect desired conductors 60, a portion of a plated-through barrel 62 being shown in broken lines in FIG. 6, because it will not be formed until after lamination of the circuits 50 with the prepreg layers 56.

Referring next to FIG. 7, which shows somewhat diagrammatically a rigid flex circuit 64 with the plated through holes 62 enlarged, in the interests of clarity, flex cables 66 coextensive with the rigid and flex sections, and extending between the rigid sections 68 and 69 for suitably connecting the printed circuits. If desired, upper and lower caps are laminated to the circuits 50 in the rigid board area 68 only. Such caps typically are fabricated using polyimide glass or epoxy glass copper-clad laminates. Copper conductor circuits can be formed on one or both sides of the caps, as desired.

With the rigid section 68, and the portions of the flex cables coextensive with the rigid section, formed by an insulator material, i.e., layers of fiberglass and adhesive, such as epoxy, which have characteristics or properties which allow the rigid board portion to relieve stresses, caused by heating, in the board, delamination of the circuits and cracking of the plated through barrels is prevented when the board, or portions thereof, is subjected to elevated temperatures.

In other words, the rigid board 68 does not contain troublesome materials, such as acrylic adhesive and Kapton, having high expansion rates and moisture absorption properties, because the flex cable sections including Kapton and acrylic adhesive only extend to but not substantially into the rigid section. Of course the Kapton and acrylic layers could extend an insubstantial distance into the rigid section without causing undue problems. Further, subjecting the inventive circuits to hot solder reflow and elevated temperatures will not cause differential expansion and contraction leading to cracking of the copper plated through barrels 62 or delamination of the layers. Moreover, extended baking times at temperatures on the order of 250° F., often as long as 48 hours, to remove moisture, are avoided. Additionally, and advantageously, use of release and/or carrier board materials in the base stock portion of the inventive board permits increased rigidity and better handling characteristics of thereof.

While the invention enables the successful fabrication of multilayer rigid flex boards having a great number of conductor layers, the invention also provides excellent multilayer rigid flex boards having fewer layers, for example on the order of as few as four conductor layers.

In the second exemplary embodiment of the invention shown in FIGS. 8–11, the initial processing step includes forming base stock 70 by laminating two copper sheets 72 and 74, for example one or two ounce copper, to an insulator layer 76 comprised of one or two fiberglass sheets impregnated with an adhesive such as epoxy, commonly referred to as prepreg. While two layers of glass have been shown, in order to provide at least 3.5 mils between the copper planes after lamination, for meeting military specifications, a single sheet of prepreg may be used in appropriate circumstances.

Following lamination of the base stock 70, the copper layers are imaged and etched to provide copper pads 78 and conductors 80 (shown diagrammatically in FIG. 9) on the glass layer 76. Exposed copper conductor patterns are then treated to enhance bondability of the epoxy prepreg to the copper, for example by the black oxide process typically used in the rigid board field.

Two additional insulator prepreg sheets 82 and 84 having cutouts 86 and 88, are positioned on both sides of the base stock 70. A flexible insulator of Kapton 90, covered with a layer of a suitable adhesive 92, for example an acrylic adhesive which provides excellent bonding of Kapton to copper, is positioned on one side of the glass sheet 82. A similar sheet of Kapton 92 covered with a layer of adhesive 96 is located on the other side of the glass sheet 84. Insulator layers such as Kapton and acrylic adhesives afford excellent flexibility and tear resistance characteristics to the flex sections, as discussed in connection with FIGS. 10 and 11.

Figure 10:
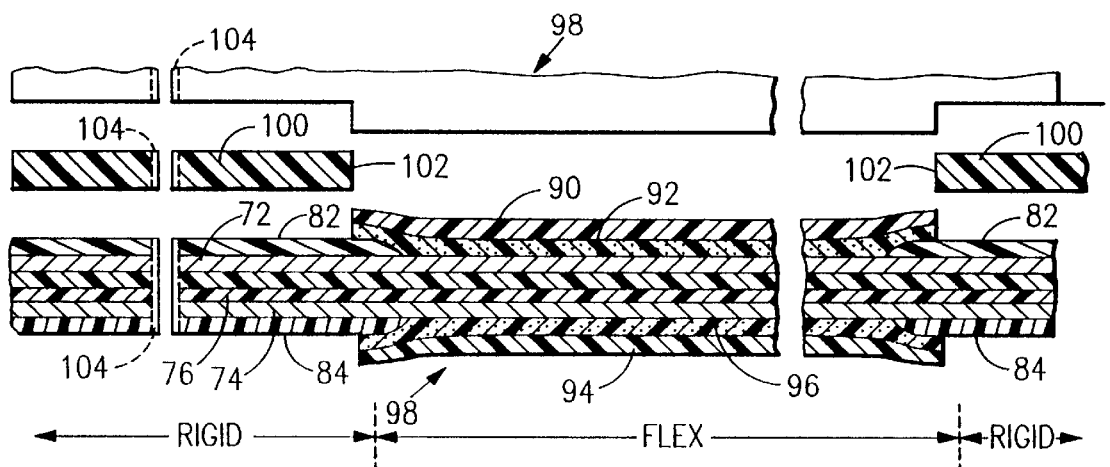
FIG. 10 is a cross section taken along view line 3—3 in FIG. 9 and enlarged in the interests of clarity.

As shown in FIG. 10, the Kapton sheets 90 and 94 and their associated adhesive layers 92 and 96 are slightly longer than the length of the cutouts 86 and 88 in the glass layers to overlap slightly the sheets 82 and 84 by, for example 0.050 inch. The sandwich formed by the foregoing sheets is then laminated together to provide the printed circuit structure 98 shown in FIGS. 9 and 10. Note that in the interests of clarity, the sides of the cutouts 86 and 88 are not shown in FIG. 10.

After lamination processing, a number of the printed circuits 98 are stacked in proper registration with epoxy impregnated fiberglass layers 100 (FIG. 10) positioned between, for example, seven of the circuits 98. For clarity, only two of the printed circuit structures 98 are shown with the upper circuit 98 illustrated diagrammatically and broken away.

Note that cutouts 102 in the prepreg sheets 100 are slightly longer than the cutouts 86 and 88 (FIG. 8) and coextensive with the Kapton layers 90 and 94 so that the Kapton layers 90 and 94 abut the edges of the sheets 100, as shown in FIG. 10.

Figure 11:
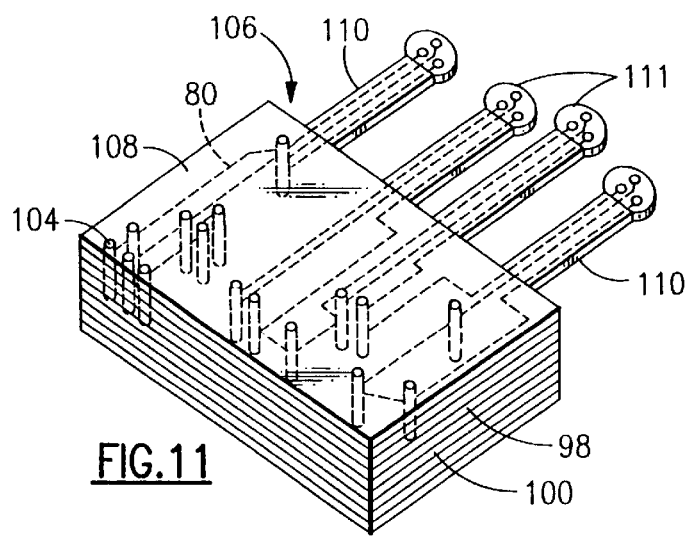
FIG. 11 is a perspective view diagrammatically showing the inventive rigid flex circuits following lamination and other processing steps of the structures shown in FIGS. 9 and 10.

Prior to stacking the circuits 98, it is desirable to cut the flex cables, shown in FIG. 11, that extend through the cutout areas, to simplify the final construction of the rigid flex printed circuit structure.

After stacking seven of the circuits 98 with appropriate outer caps, the layers are laminated to provide, in this example, a sixteen layer rigid flex circuit (the outer caps add in this example one layer per cap), and holes are then drilled at appropriate pads 78 to interconnect desired conductors 80. The holes are then desmeared by a suitable process, for example, exposing them to appropriate cleaning chemicals to expose fully the copper conductors, a rapid process due to the absence of any adhesives or insulating material resistant to such chemicals, such as acrylics and Kapton, in the rigid circuit portion. If desired, plasma desmearing techniques can be used instead of chemical cleaning.

The holes are then plated through to interconnect desired conductors 80, a portion of a plated-through barrel 104 being shown in broken lines in FIG. 10, because it will not be formed until after lamination of the circuits 98 with the prepreg layers 100.

As discussed above, problems of thermal expansion and moisture retention in the rigid section, which have been encountered in the past with materials such as Kapton and acrylic adhesives, are avoided by the absence of such materials.

Referring next to FIG. 11, which shows somewhat diagrammatically a rigid flex circuit 106 with the plated through holes 104 enlarged, in the interests of clarity, flex cables 110 coextensive with the rigid and flex sections, and extending between the rigid sections 108 and 111 for suitably connecting the printed circuits. If desired, upper and lower caps are laminated to the circuits 98 in the rigid board area 108 only. Such caps typically are fabricated using polyimide glass or epoxy glass copper-clad laminates. Copper conductor circuits can be formed on one or both sides of the caps, as desired.

With the rigid section 108, and the portions of the flex cables coextensive with the rigid section, formed by an insulator material, i.e. layers of fiberglass and an adhesive, such as epoxy, which have characteristics or properties which allow the rigid board portion to relieve stresses, caused by heating in the X and Y plane of the board, delamination of the circuits and cracking of the plated through barrels is prevented when the board is subjected to elevated temperatures.

In other words, the rigid board 108 does not contain troublesome materials, such as acrylic adhesive and Kapton, having high expansion rates and moisture absorption properties, because the flex cable sections including Kapton and acrylic adhesive only extend to but not substantially into the rigid section. Of course, the Kapton and acrylic layers could extend an insubstantial distance into the rigid section without causing undue problems. Subjecting the inventive circuits to hot solder reflow and elevated temperatures will not cause differential expansion and contraction leading to cracking of the copper plated through barrels 104 or delamination of the layers. Moreover, extended baking times at temperatures on the order of 250° F., often as long as 48 hours, to remove moisture, are avoided.

While the invention enables the successful fabrication of multilayer rigid flex boards having a great number of conductor layers, the invention also provides excellent multilayer rigid flex boards having fewer layers, for example, on the order of as few as four conductor layers.

While the invention has been shown and described with reference to the above described embodiments, which provide rigid flex circuits affording advantages not found in prior art printed circuits, it will be understood that various changes may he made without departing from the spirit and scope of the invention as defined in the appended claims. For example, imaging and connection of the conductors of the circuits may be accomplished by covering the whole board with a layer of photoimagable solder mask to permit the whole board to be processed at once. Advantageously, this greatly reduces the costs of performing this processing step, and thus, reduces the overall cost of the resulting board. Other modifications are also possible.

What is claimed is:

1. A printed circuit basestock composite precursor for preparation of two single sided basestock laminates, said basestock composite consisting of:

two conductor layers;

two insulating layers, each insulating layer being laminated to one of the conductor layers, each of said insulating layers comprising a single layer of insulating material;

a release layer positioned between said insulating layers, wherein said release layer is not coextensive with the borders of said insulating layers.

2. The basestock composite of claim 1, wherein the release layer is polyvinylfluoride.

3. The basestock composite of claim 1 wherein the single layer of insulating material is a fiberglass layer impregnated with epoxy adhesive.

* * * * *